US009905718B2

(12) United States Patent
Wang et al.

(10) Patent No.: US 9,905,718 B2
(45) Date of Patent: Feb. 27, 2018

(54) LOW-COST THIN-FILM CONCENTRATOR SOLAR CELLS

(75) Inventors: Dong Wang, HangZhou (CN); Pingrong Yu, Santa Clara, CA (US); Xuegeng Li, Sunnyvale, CA (US)

(73) Assignee: PU NI TAI YANG NENG (HANGZHOU) CO., LIMITED, Hangzhou (CN)

( * ) Notice: Subject to any disclaimer, the term of this patent is extended or adjusted under 35 U.S.C. 154(b) by 592 days.

(21) Appl. No.: 13/568,537

(22) Filed: Aug. 7, 2012

(65) Prior Publication Data
US 2014/0041708 A1    Feb. 13, 2014

(51) Int. Cl.
*H01L 31/054* (2014.01)
(52) U.S. Cl.
CPC ...... *H01L 31/0543* (2014.12); *H01L 31/0547* (2014.12); *Y02E 10/52* (2013.01); *Y02E 10/542* (2013.01)
(58) Field of Classification Search
USPC ................................. 136/246, 259
See application file for complete search history.

(56) References Cited

U.S. PATENT DOCUMENTS

| 6,057,505 | A  | * | 5/2000 | Ortabasi ................. | 136/246 |
| 6,284,966 | B1 | * | 9/2001 | Simburger et al. ........ | 136/244 |
| 2009/0266396 | A1 | * | 10/2009 | Niira et al. ................ | 136/244 |
| 2010/0024867 | A1 | * | 2/2010 | Gillespie .................. | 136/246 |
| 2010/0089447 | A1 | * | 4/2010 | Basol et al. ............. | 136/256 |
| 2010/0212719 | A1 | * | 8/2010 | Stolum ...................... | 136/246 |
| 2011/0074056 | A1 | * | 3/2011 | Louh ......................... | 264/2.7 |

OTHER PUBLICATIONS

"Lens," The Oxford English Dictionary, Second Edition, 1989.*
Keller, Bob "Bob's Rock Shop: Refractive Index and Critical Angle" http://www.rockhounds.com/gem_designs/refractive_index/index.shtml Retrieved Jul. 16, 2013.*
Woodford, Chris. (2008) Fresnel lenses. Retrieved from http://www.explainthatstuff.com/fresnel-lenses.html, accessed Aug. 31, 2014.*

* cited by examiner

*Primary Examiner* — Magali P Slawski
(74) *Attorney, Agent, or Firm* — Chen Yoshimura LLP (57) ABSTRACT

A low cost concentrating photovoltaic system includes a condenser system having refractive or reflective optics and a photovoltaic module having one or more thin film solar cells. The thin film solar cells may be a-Si, CdTe, Cu(InGa)Se$_2$, organic solar cell or dye sensitized solar cells. The condenser system may be a flat, cylindrical or hemispherical Fresnel lens, a parabolic reflector, a compound parabolic concentrator, a reflective V-trough, or a combination thereof. The condenser system has a concentration ratio of about 10 to 100 or higher. No tracking system is needed in many examples, or a simple one-axis tracking may be used. In one example, the condenser system uses a hemispherical Fresnel lens which focuses sunlight onto a hemispherical focal surface, and one thin film solar cell (mounted on a tracking unit) or multiple cells (without tracking) are disposed on the hemispherical focal surface of the Fresnel lens.

5 Claims, 14 Drawing Sheets

LOW-COST THIN-FILM CONCENTRATOR SOLAR CELLS

BACKGROUND OF THE INVENTION

Field of the Invention

This invention relates to solar concentrating photovoltaic technology, and in particular, to a low cost photovoltaic concentrator system.

Description of the Related Art

Many technologies for harnessing clean and renewable solar energy have been applied to produce heat, electricity, and fuels. The applications span through the residential, commercial, industrial, agricultural, and transportation sectors. One of the most widely applied technologies is to generate electricity, also known as photovoltaics (PV). Commercial PV systems range in size from mega watt (MW) power plants to rooftop power systems to portable electronics.

However, the cost of solar energy conversion needs to be further reduced to make solar energy a more desirable choice of energy source. Currently, electricity generated by solar power is typically a few times more expensive than electricity generated by burning fossil fuels.

One of the means to lower the solar electricity cost is to use refractive lens and reflective minors to concentrate sunlight onto PV cells. Such systems are known as concentrating PV (CPV) or concentrators. CPV allows for a reduction in the cell area and therefore the cost for producing a certain amount of electricity. However, most of the traditional concentrators are based on group III-V multi-junction cells, which are very expensive (on the order of US$10/cm$^2$) and typically used in space programs although it has the highest efficiency. This is one of the two key factors limiting the capability of CPV to compete with conventional crystalline silicon flat panels.

SUMMARY OF THE INVENTION

Various less expensive thin-film technologies, including a-Si:H, nc-Si, CdTe, Cu(InGa)Se$_2$ (CIGS), organic PV, and dye-sensitized solar cells (DSSC), have been developed. The costs for such thin-film cells are in the range of US$0.05-1.0/cm$^2$. Embodiments of the present invention provide a thin-film CPV (or thin-film concentrator), in which the expensive III-V multi-junction cells are replaced by inexpensive thin-film solar cells in CPVs. This approach allows CPVs to further reduce the cost for solar electricity.

Another key factor financially limiting the traditional CPV is the optics, cooling system, and tracking system. The current economics imply that the III-V multi-junction cells should be implemented in a system with a concentration ratio of at least 400x. Such a high concentration requires the CPV to track the sun highly precisely over the daytime. This results in the employment of very expensive optics and dual axis tracking system. Instead, using cost effective thin-film cells according to embodiments of the present invention provides much more flexibility in choosing the concentration ratio, which may be in the range from 1 to several hundred. Low concentration (<40x) only requires coarse tracking or even no tracking at all.

Furthermore, thin-film solar cells can be readily modified to meet the special need for CPV without significantly interfering with performance. For instance, thermally conductive substrates can be used to keep the cells at relatively low temperature; suitable grid design allows CPV to effectively collect the high electrical current under concentrated light; etc.

A general problem in solar cell manufacturing is that the performance tends to diminish when scaled up from cells to the size of modules and panels. However, in CPV, this problem is minimized since the cell area is small and the need for large panels is diminished. Thus, high performance on the cell level is maintained. In some types of thin-film cells, as shown later, the cell performance is even enhanced under concentrated light or elevated temperature as compared to that under regular one sun irradiance.

Generally speaking, although the traditional CPV uses the most efficient (30-40%) III-V multi-junction cells, the high cost for the cell itself and the tracking unit makes it difficult to compete with other non-concentrating flat panels. The adoption of moderate efficient (approaching 20%) thin-film cells is a more cost-effective approach having several advantages over traditional CPV as stated above.

Accordingly, the present invention is directed to a concentrating photovoltaic system that substantially obviates one or more of the problems due to limitations and disadvantages of the related art.

An object of the present invention is to provide a low cost concentrating photovoltaic system.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a concentrating photovoltaic system, which includes: a condenser system including a hemispherical Fresnel lens which focuses sunlight onto a hemispherical focal surface; and a photovoltaic module disposed on the hemispherical focal surface of the Fresnel lens. The photovoltaic module may include a plurality of thin film solar cells arranged on the hemispherical focal surface of the Fresnel lens. The system may further include a tracking unit for mounting a single thin film solar cell and moving it along the hemispherical focal surface of the Fresnel lens.

In another aspect, the present invention provides a concentrating photovoltaic system, which includes: a condenser system including refractive or reflective optics for collecting and condensing sunlight; and a photovoltaic module including one or more thin film solar cells for receiving the condensed sunlight and generating electricity. The thin film solar cells may be a-Si, CdTe, Cu(InGa)Se$_2$, organic solar cell or dye sensitized solar cells. The condenser system may include a point focus flat Fresnel lens, a cylindrical shaped Fresnel lens, a hemispherical Fresnel lens, a parabolic reflector, a compound parabolic concentrator, a reflective V-trough, or a combination thereof. The condenser system has a concentration ratio of about 10 to 100.

It is to be understood that both the foregoing general description and the following detailed description are exemplary and explanatory and are intended to provide further explanation of the invention as claimed.

DETAILED DESCRIPTION OF THE PREFERRED EMBODIMENTS

Embodiments of the present invention use optical components to reduce solar energy conversion cost, and/or to achieve enhanced solar energy conversion performance with limited light absorption area. Various systems according to embodiments of the present invention use optical components such as refractive and/or reflective elements that concentrate light onto small area thin film cells.

Some embodiments of the present invention provide photovoltaic concentrator systems using curved hemispherical Fresnel lens as a condenser. Thin film cells are arranged on a curved focal surface, so that sun light is directly incident on some thin film cells regardless of the incident angle. Thus, light collection can be performed without the need for a tracking system, which lowers the cost of the system.

Traditional glass refractive lenses are too thick (heavy) and expensive to be practical in solar concentrators. Therefore, Fresnel lenses are commonly used. A Fresnel lens can be considered a standard plano-convex lens that has been collapsed at a number of locations into a thinner profile, as shown in FIG. 1B. In this disclosure, "Fresnel lens" generally refers to thin and light-weight refractive optics and may be manufactured from glass, plastics, or molding plastics materials to the underside of a glass substrate.

In this disclosure, "reflective optical components" or "reflector" generally refer to any reflective material, including for example coated glass, metal sheets, etc. The size and shape of the reflective optical components may vary to satisfy specific applications, and may include parabolic dish, CPC, V-trough, etc. as described in more detail below.

In this disclosure, "thin film solar cells" or "cells" generally refer to any solar cells using thin film technology, including but not limited to a-Si:H, nc-Si, CdTe, CIGS, DSSC, and Organic PV. "Light" refers generally to any light that can be absorbed by the solar cells, including solar light and indoor light and including wavelengths outside the visible spectrum.

FIGS. 1A-10C illustrate various configurations of solar concentrator systems used with thin film solar cells according to embodiments of the present invention.

Figure 1A:
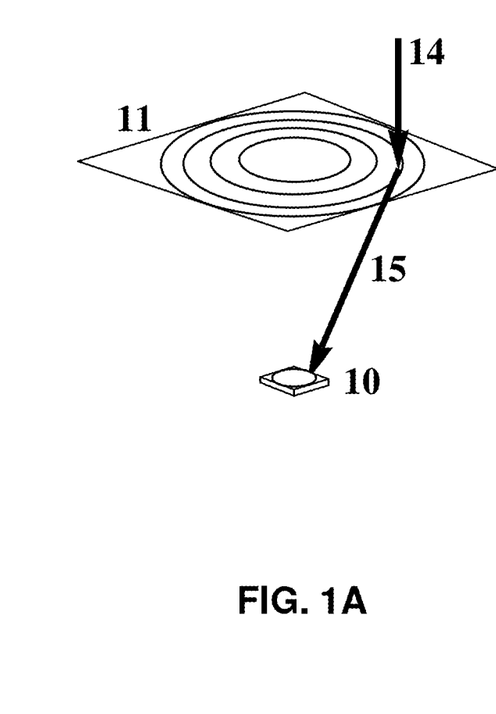
FIGS. 1A and 1B schematically illustrate a system using point focus Fresnel lens to concentrate light onto thin film solar cells according to embodiments of the present invention.
Figure 1B:
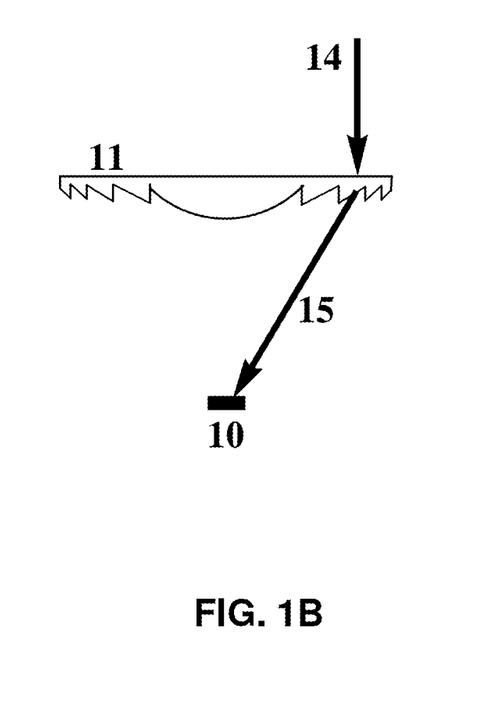

In FIGS. 1A (perspective view) and 1B (cross sectional view), a Fresnel lens 11 with a point-focus concentrates light 14 on to a thin film solar cell 10. The refracted light 15 concentrate to a circular area on the cell 10. The concentration depends on this circular area and the effective area of the lens. Since most of the thin film cells have a square shape, cell areas in the four corners may not be illuminated. Multiple such point-focus concentrators can be arranged in arrays to collect light from an extended area.

Figure 2A:
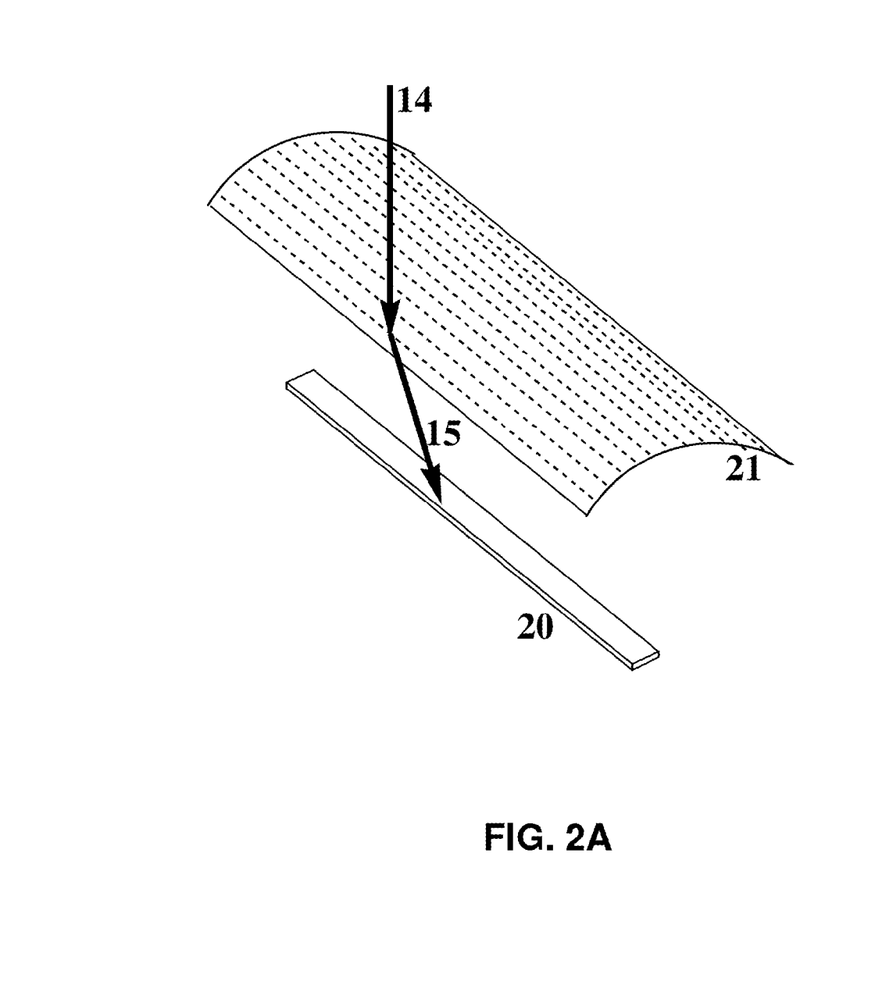
FIGS. 2A and 2B schematically illustrate a system using line focus Fresnel lens to concentrate light onto thin film solar cells according to embodiments of the present invention.
Figure 2B:
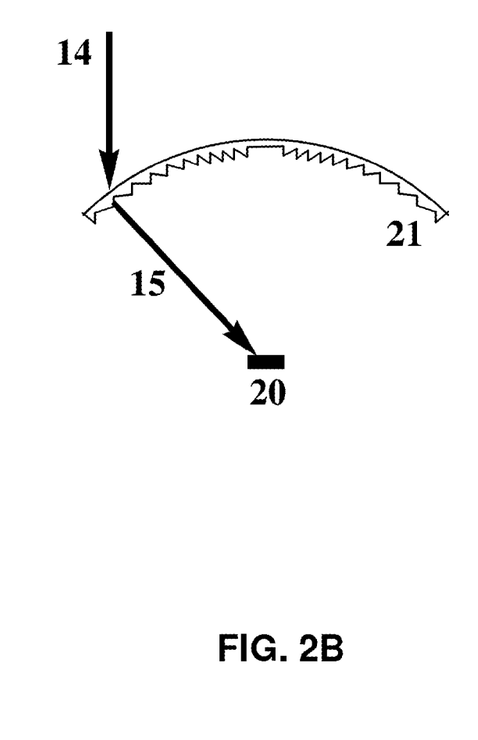

In FIGS. 2A (perspective view) and 2B (cross sectional view), a cylindrical shaped Fresnel lens 21 with a line-focus concentrates light 14 on to a linear array of thin film solar cells 20 arranged on the elongated focal plane of the Fresnel lens. The concentration ratio (also referred to simply as concentration) is the ratio of effective area of the lens to the area of the cell array. The cross sectional view of FIG. 2B is along a longitudinal axis of the concentrator 21. The cylindrical shaped design of the concentrator 21 minimizes image dispersion due to chromatic aberration and flexural distortion. It also provides greater rigidity of the lens.

Figures 3A, 3B, 3C:
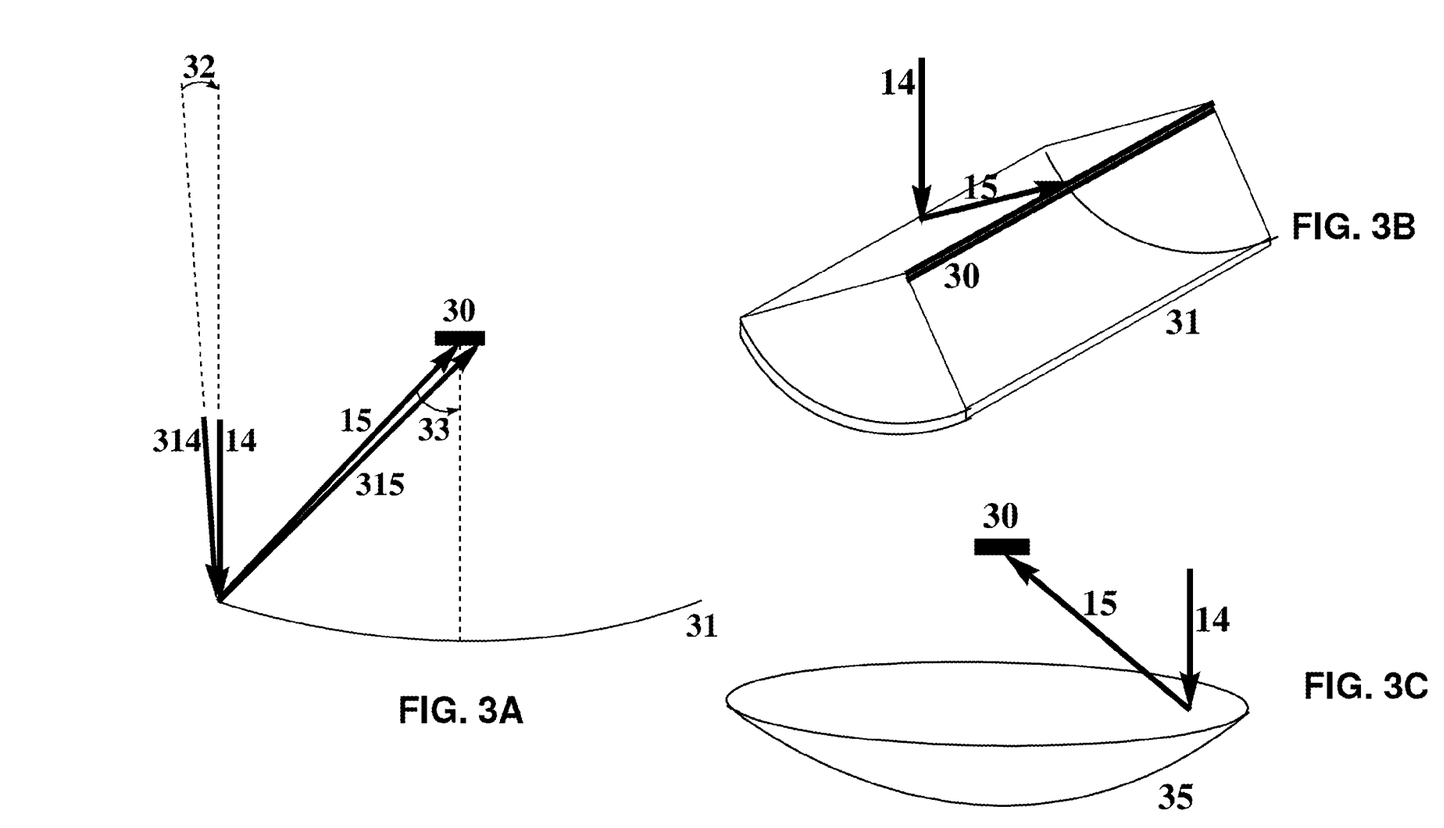
FIGS. 3A-3C schematically illustrate systems using a reflective parabolic cylinder or parabolic dish to concentrate light onto thin film solar cells according to embodiments of the present invention.

In addition to refractive lenses, reflective optical components can be used to concentrate light. FIG. 3A shows a two-dimensional cross sectional view of a reflective surface 31 with the shape of parabola to redirect light onto a cell 30 placed at the focal point of the parabola. Input light rays 14 that are parallel to the normal (vertical) axis of the parabola are reflected to the center of the cell 30, where the reflected rays 15 impinge on the cell at an angle 33 relative to the vertical axis. Input light rays 314 that are within an acceptance angle 32 with respect to the vertical axis can also be reflected onto the surface of the cell 30. The three-dimensional shape of the reflective surface 31 may be a linear parabolic trough as shown in FIG. 3B, formed by translating the parabola 31 of FIG. 3A in a linear direction perpendicular to the cross-section (i.e., the cross-sectional view of FIG. 3A is taken along the longitudinal direction of the trough). The light concentration C on the cell 30 is determined by:

$$C=\cos(33)^2 \cdot \sin(33)/\sin(32)$$

The three-dimensional shape of the reflective surface may also be a paraboloid as shown in FIG. 3C, formed by rotating the parabola of FIG. 3A around the vertical axis. The concentration in this case is determined by:

$$C=\cos(33)^2 \cdot \sin(33)^2/\sin(32)^2$$

Figure 4:
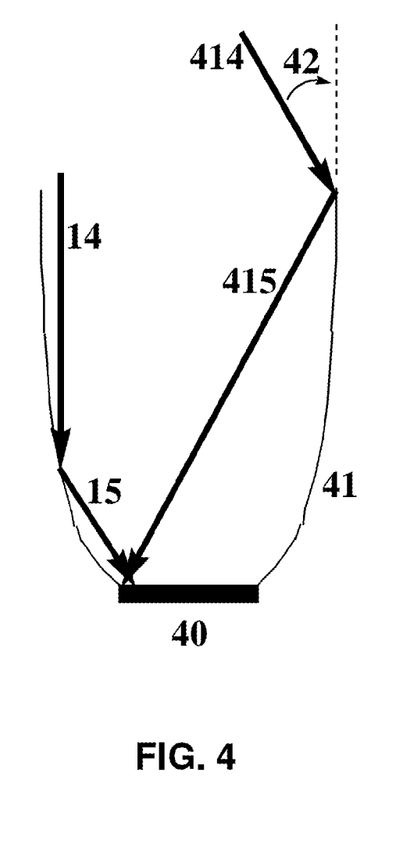
FIG. 4 schematically illustrates a system using a reflective compound parabolic concentrator (CPC) to concentrate light onto thin film solar cells according to an embodiment of the present invention.

FIG. 4 shows a two-dimensional cross sectional view of a compound parabolic concentrator (CPC) 41 with a thin film solar cell disposed at the bottom of the CPC. The CPC may be filled with a dielectric material such as oil (or air). The cross sectional view of the CPC consists of two parabolic curves; the vertical axis of each parabolic curve is tilted by an angle 42 with respect to the central vertical axis of the CPC, such that the foci of the two parabolic curves are located at opposite edges of the cell 40. The light concentration C of the two-dimensional configuration is determined by:

$$C=n/\sin(42)$$

where n is the refractive index of the dielectric material in the CPC. The three-dimensional shape of the CPC is formed by rotating the lines of the cross sectional view around the central vertical axis of the CPC. The concentration of the three-dimensional CPC is determined by:

$$C=n^2/\sin(42)^2$$

Figure 5:
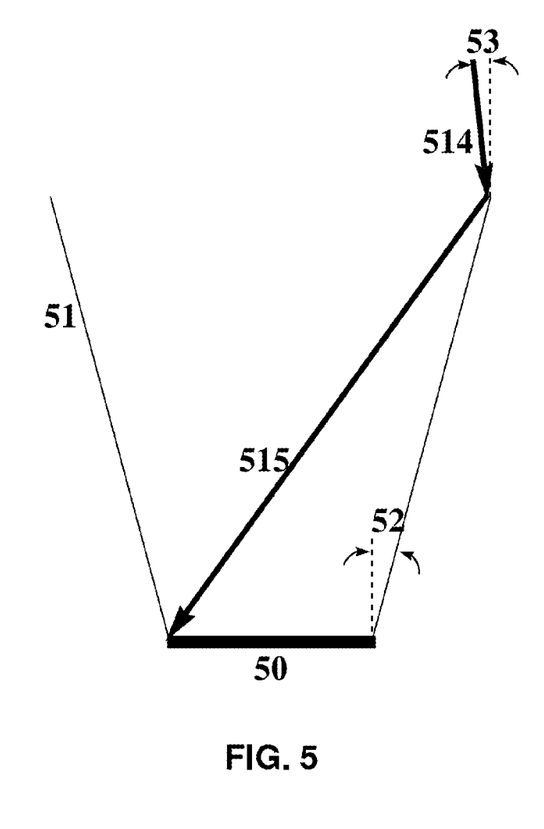
FIG. 5 schematically illustrates a system using a reflective V-trough concentrator to concentrate light onto thin film solar cells according to an embodiment of the present invention.

In a CPC, under typical illumination conditions, most of the light is focused on the edges of the receiving cell. To achieve a more uniform intensity pattern, a reflective V-trough 51 is used, as shown in FIG. 5. The incident light 514 arriving at the rim of the V-trough within an acceptance angle 53 with respect to the vertical axis can be reflected to the cell 50. If the wall of the V-trough is tilted by an angle 52 with respect to the vertical axis, then the concentration is:

$$C=n \cdot \{1+2 \cdot \sin(52) \cdot \cos[(53)+2 \cdot (52)]/\sin[(53)+(52)]\}$$

where n is the refractive index of the dielectric material filling the V-trough. Two-axis V-trough concentrators may be made either by rotating the lines of the V-trough in the two-dimensional view about the central vertical axis, forming an inverted truncated cone, or by combining two linear V-troughs at right angles, forming an inverted truncated pyramid. Such a two-axis V-trough has a concentration of:

$$C=n^2 \cdot \{1+2 \cdot \sin(52) \cdot \cos[(53)+2 \cdot (52)]/\sin[(53)+(52)]\}^2$$

Figure 6A:
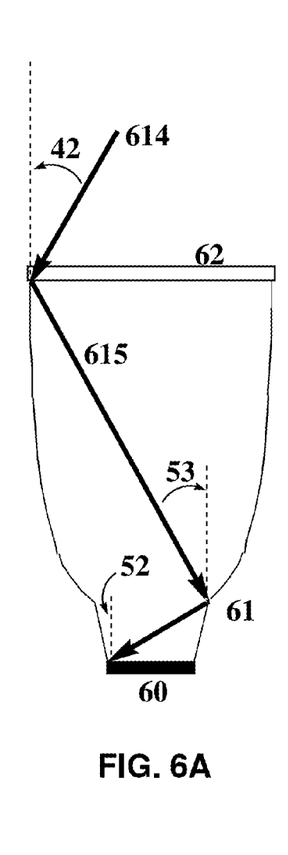
FIGS. 6A-6C and 7A-7C schematically illustrate systems using combinations of compound parabolic trough and V-trough to concentrate light onto thin film solar cells according to embodiments of the present invention.

Concentrators can be combined to achieve higher concentration or more uniform intensity pattern on the cell. In FIG. 6A, the concentrator 61 consists of a CPC as a primary optics and a V-trough as the secondary optical element (SOE). In one example, the angles 42, 53, and 52 are 30°, 30°, and 15°, respectively. According to the equation above, the concentrations for both troughs can be calculated and their product is the overall concentration of the concentrator in the two-dimensional configuration is:

$$C=2 \cdot 1.366n=2.732n$$

Figure 6B:
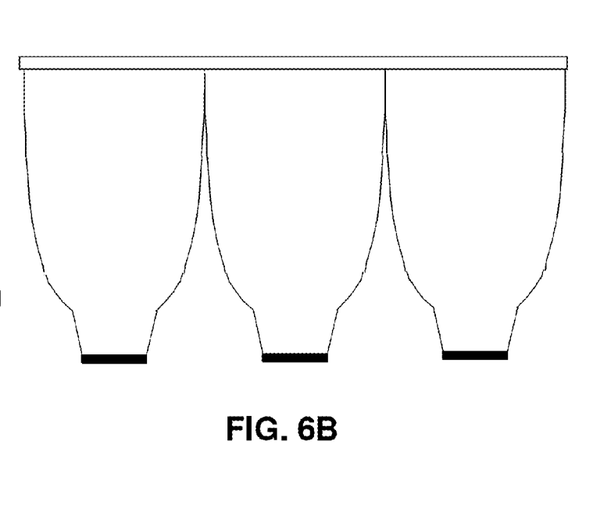
Figure 6C:
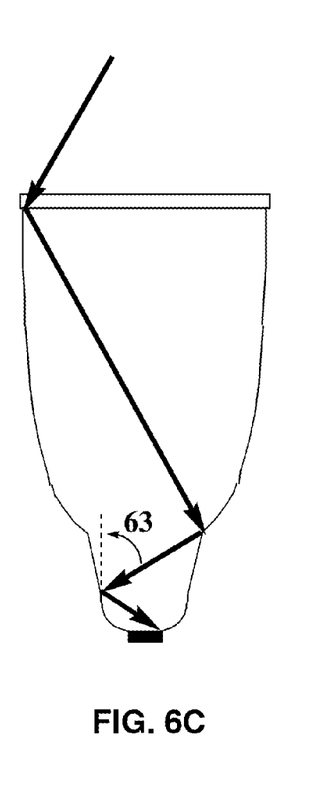

If an additional tertiary CPC with acceptance angle 63, in this example, 60°, is added as shown in FIG. 6C, then the overall concentration of the concentrator in the two-dimensional configuration is:

$$C=2 \cdot 1.366 \cdot 1.155n=3.155n$$

For a three-dimensional concentrator based on this two-dimensional configuration, the concentration is:

$$C=2^2 \cdot 1.366^2 \cdot 1.155^2 \cdot n^2=9.954n^2$$

where n is the refractive index of the dielectric material filling the concentrator. Such a combined design can be extended to module as shown in FIG. 6B, where a plurality of such combination concentrators are disposed in a row. In this example, a superstrate 62 with high transmission is used as a cover to protect the cell 60 and seal the concentrator if it is filled with a liquid dielectric material.

Figures 7A, 7B, 7C:
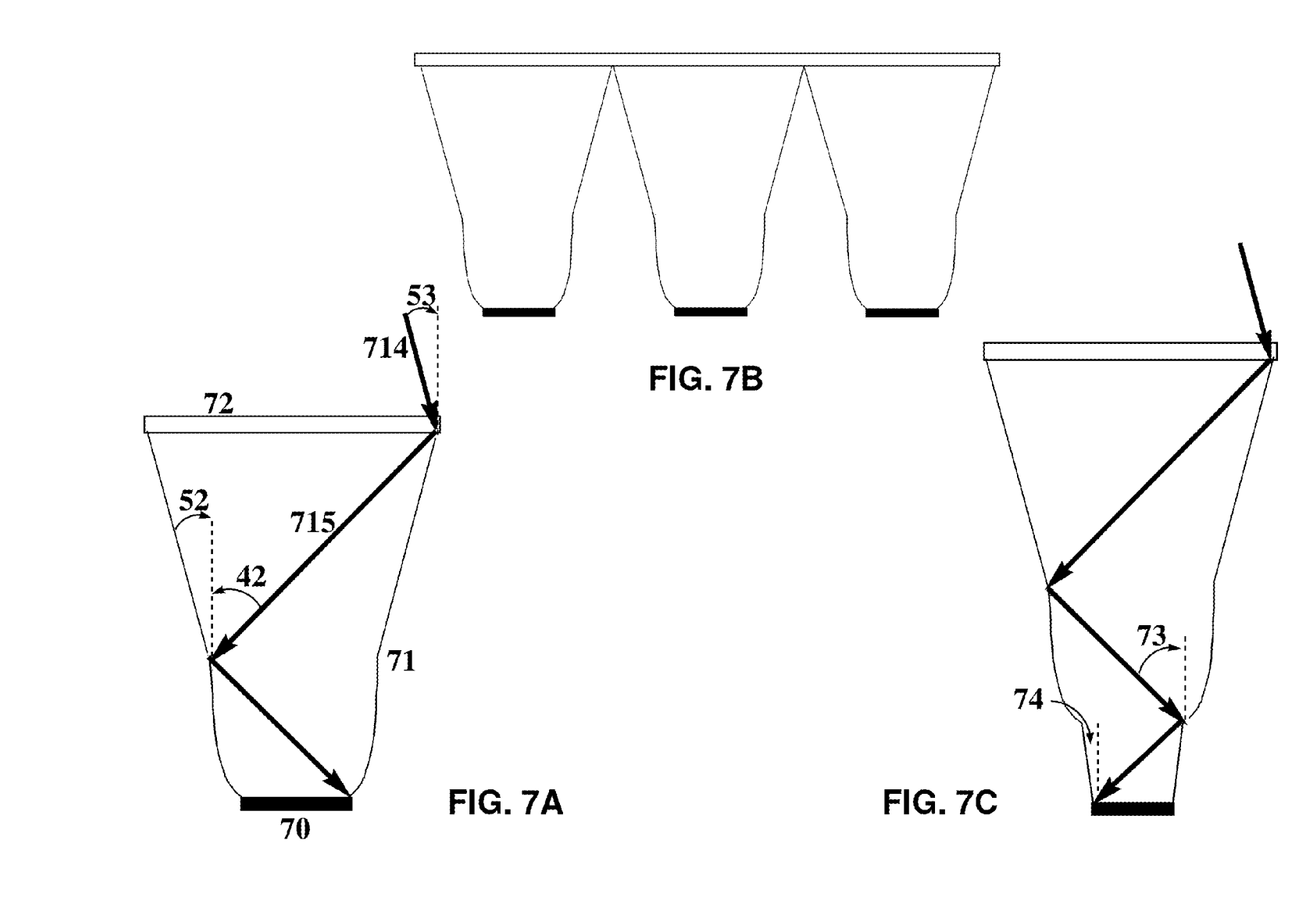

FIG. 7A shows a concentrator 71 which has a V-trough as the primary optics and a CPC as the SOE. In one example, the angle 53, 52, and 42 are 15°, 15°, and 45°, respectively. The overall concentration of the concentrator in the two-dimensional configuration is:

$$C=1.414 \cdot 1.732n=2.449n$$

If an additional tertiary V-trough with acceptance angle 73 and tilt angle 74, in this case 45° and 10° respectively, is added as shown in FIG. 7C, then the concentration is $$C=1.414 \cdot 1.732 \cdot 1.179n=2.887n$$

For a three-dimensional concentrator based on this two-dimensional configuration, the concentration is:

$$C=1.414^2 \cdot 1.732^2 \cdot 1.179^2 \cdot n^2=8.337n^2$$

where n is the refractive index of the dielectric material filling the concentrator. Such a combined design can also be extended to module as shown in FIG. 7B. In this example, a superstrate 72 with high transmission is used as a cover to protect the cell 70 and seal the concentrator if it is filled with a liquid dielectric material.

The significance for this combination design is that, without the filling dielectric, a 10× uniform concentration is achievable with a wide acceptance angle of 30° by using inexpensive reflective materials. Economically, a 10× concentration is not enough to justify the cost of costly III-V multijunction cells; however, it is enough to make thin film solar cell-based systems commercial. As will be shown later, thin film cells also perform excellently under a concentration of 10×. Large acceptance angle may eliminate the need for sophisticated tracking systems or any tracking system at all. Additionally, a 10× concentration usually does not require active cooling. In other words, by using such a system, 90% of the thin film cells' cost will be saved and only low-cost optics and tracking system are added.

Figure 8:
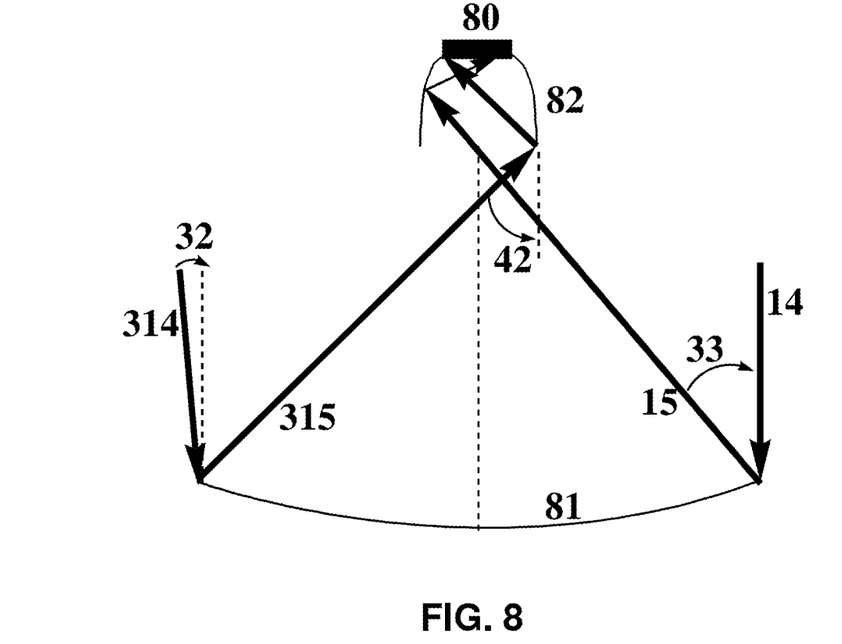
FIG. 8 schematically illustrate a system using a combination of parabolic dish and CPC to concentrate light onto thin film solar cells according to an embodiment of the present invention.

Other concentrator systems can achieve a concentration much higher than 10×, such as 100×, if needed. For example, the system shown in FIG. 8 uses a parabolic trough 81 as the primary optics and a CPC 82 as the SOE. Alternatively (not shown), a V-trough may also be used as the SOE. When the angle 32 (acceptance angle), 33 (angle of the reflected light by the parabolic trough 81 when the incident light is parallel to the vertical axis), and 42 (tilt angle of the vertical axes of the parabolic curves in the CPC 82) are 5°, 40°, and 45° respectively, the concentration for this two-dimensional configuration is:

$$C=5.651 \cdot 1.414n=7.991n$$

For a three-dimensional concentrator based on such two-dimensional configuration, the concentration is:

$$C=5.651^2 \cdot 1.414^2 n^2=63.86n^2$$

where n is the refractive index of the dielectric material filling the concentrator. The acceptance angle 32 of 5° makes low-cost one-axis tracking unit usable. Much higher concentration may be achieved if the acceptance angle 32 is smaller. For example, for an angle 32 of ¼°, which is the natural acceptance angle of the sun, the concentration is more than 10000. However, in this case, the optics must be manufactured perfectly, i.e. with small tolerance for slope error in the reflective surface. What's more, precise two-axis tracking system and active cooling are required. All of these will increase the cost of the concentrator.

Figure 9A:
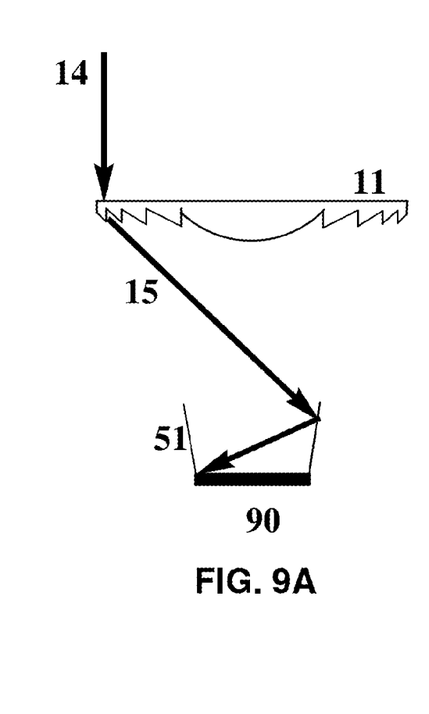
FIGS. 9A-9C schematically illustrate systems using combinations of refractive Fresnel lens and reflective V-trough to concentrate light onto thin film solar cells according to embodiments of the present invention.
Figures 9B, 9C:
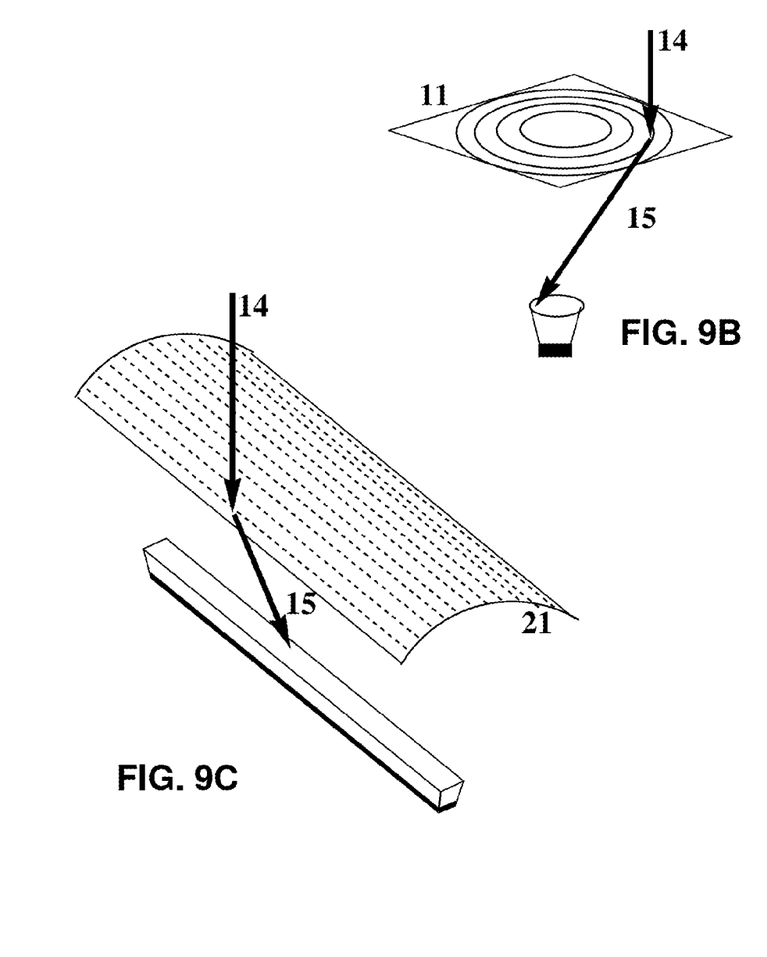

Another approach to obtain high concentration is to combine refractive Fresnel lens 11/21 and reflective V-trough (SOE) 51 as shown in FIG. 9A-9C. Since the concentration depends on the geometric ratio between Fresnel lens and the thin film solar cells, high flux up to a thousand can be achieved readily. The main purpose of the SOE, V-trough 51, is to smooth the flux profile over the cell. Alternatively (not shown), a CPC may also be used as the SOE. However, the use of Fresnel lens to obtain high flux usually requires tracking.

Figure 10A:
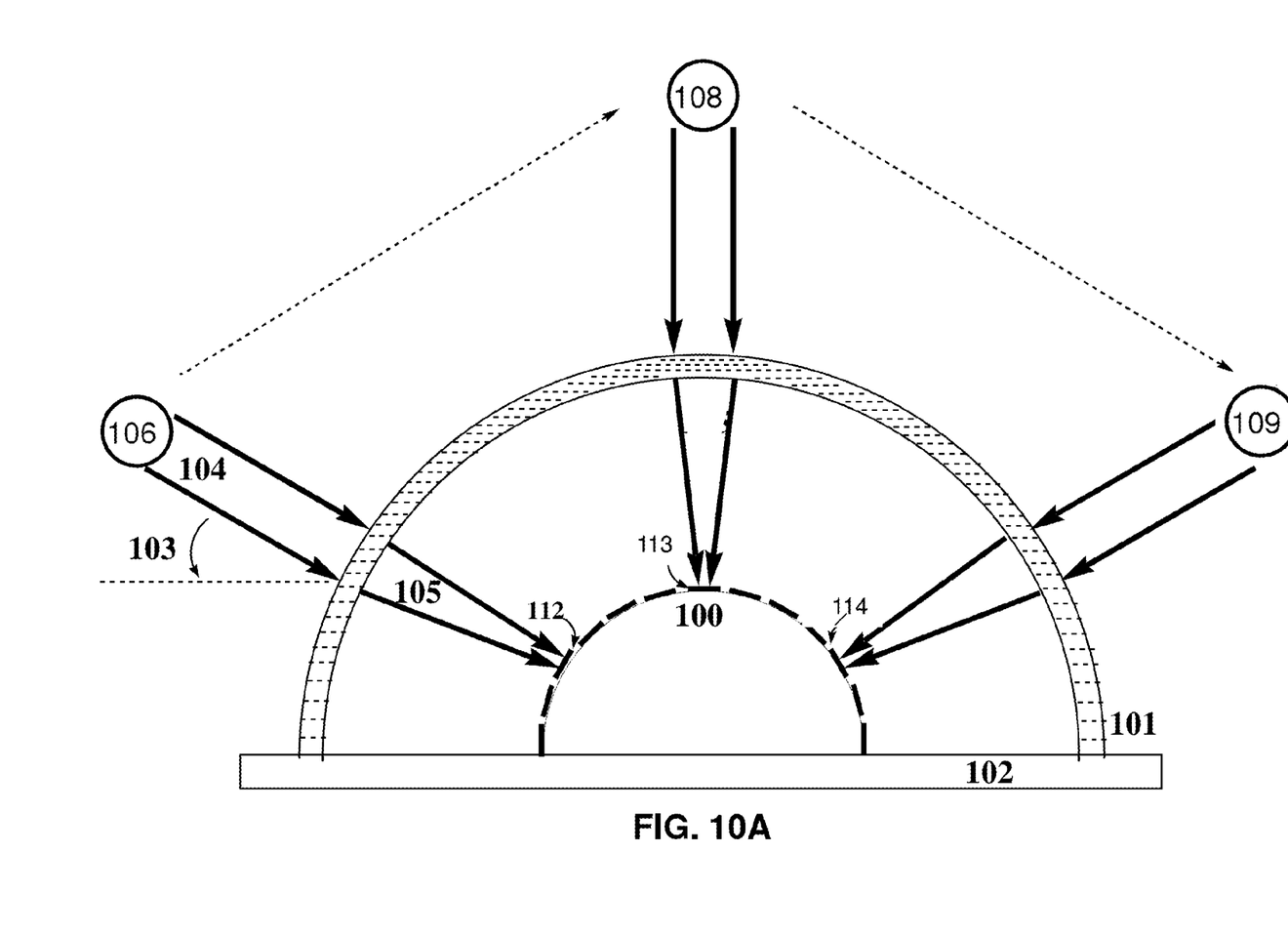
FIGS. 10A-10D schematically illustrate systems using bent Fresnel lens facing the sun to concentrate light onto thin film solar cells according to embodiments of the present invention.

FIG. 10A is a schematic description of a design using bent Fresnel lens 101 without tracking. Since the Fresnel lens is bent, the focal surface is bent shape too. A number of small thin film cells 112, 113, 114, etc. are place in an arrangement along the bent focal surface 100 to receive the concentrated light. The advantage of this design is that, when the Fresnel lens is placed to generally facing the sun, there are always some cells facing the direct incident light from the sun even without tracking. Thus, the entire direct incidence light from the sun can be collected by the cells regardless of the incident angle 103. For instance, in the morning, the sun is at a position 106 with an incident angle 103 of 30°, and the direct sunlight 104 is concentrated into rays 105 on the cell 112; at around noon, the sun is at a position 108, and the direct sunlight is concentrated on the cell 113; whereas, in the afternoon, the sun is at a position 109 and the direct sunlight is concentrated on the cell 114. As long as the plane of the cells array matches well with the focal surface 100 (which requires small cells), the direct incident sunlight, which is about 80% of the daily irradiance from sunrise to sunset, can be completely collected by the cells. This design does not require tracking; therefore it can be installed on a rooftop 102.

Figure 10B:
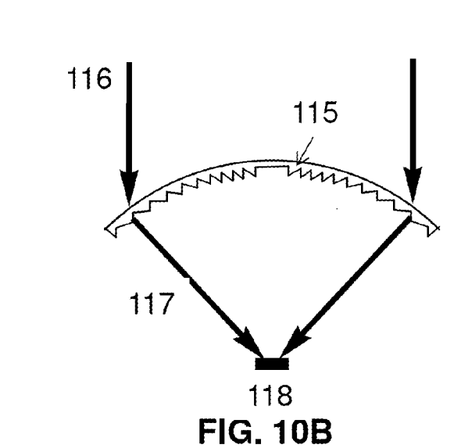

FIG. 10B is a cross sectional view showing another bent Fresnel lens 115 along a longitudinal direction thereof. This Fresnel lens focuses sunlight 116 into rays 117 on the center of the focal plane 118. In this a cylindrical shaped Fresnel lens is used, similar to that shown in FIGS. 2A and 2B.

Figure 10C:
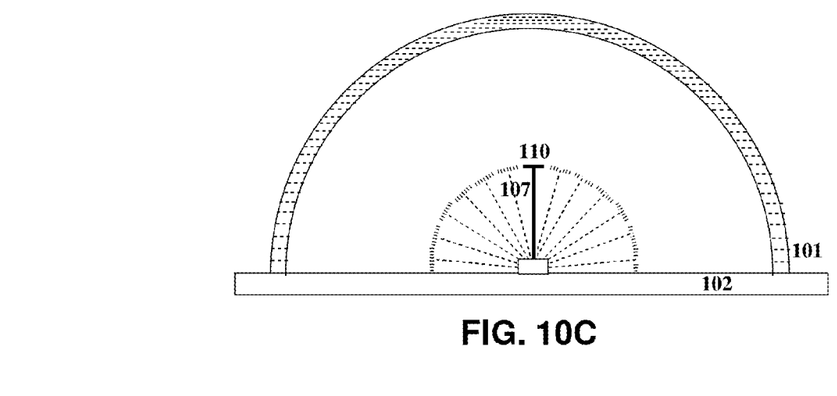

In FIG. 10A, multiple cells 112, 113, 114, etc. are employed facing different direction to collect the concentrated sunlight coming from different positions of the sub. An alternative system that uses only one cell 110 is shown in FIG. 10C. A tracking unit 107 moves the cell 110 along the focal surface. In this system, the usage of thin film cells is reduces at the cost of a one-axis tracking unit 107. The tracking unit 107 has a relatively simple structure it only moves one cell, while in conventional concentrators, the tracking units have to be able to move both the cells and the optics.

Figure 10D:
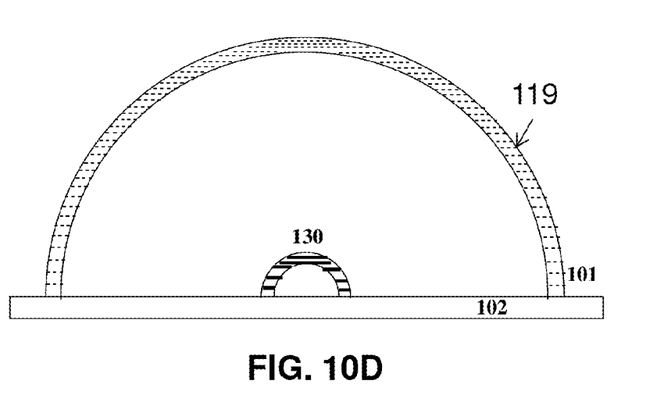

In another alternative structure shown in FIG. 10D, a hemispherical Fresnel lens is used, which is formed by rotating the two-dimensional cross-sectional curve shown in FIG. 10A around the central vertical axis. In this case, even non-direct incident can be collected by the receiving cells. To ensure that the cells face all possible directions, a large number of cells are needed to cover the hemispherical focal surface. Alternatively, a thin film cell 130 in a hemispherical shape conforming to the shape of the focal surface of the Fresnel lens may be used. Such a system provides a concentrator without any tracking unit or more than one cell. Or, in lieu of a hemispherical thin film cell, multiple thin film cells may be deposited on a flexible substrate which can be easily bent.

Figure 11A:
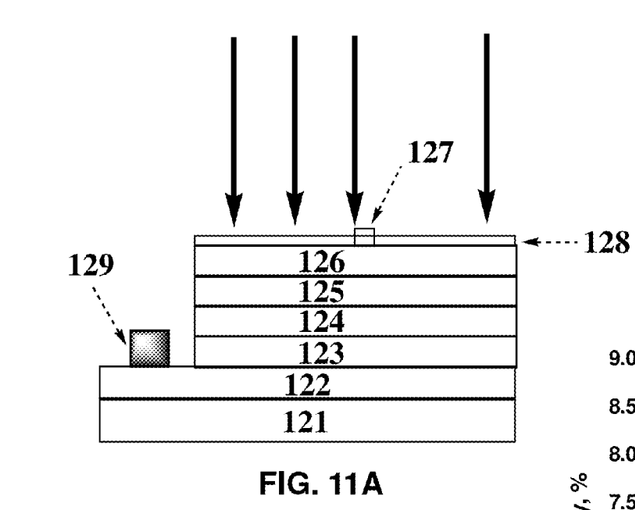
FIG. 11A schematically illustrates a CIGS solar cell.

The various optics designs allow the thin film cells with a variety choice of concentrated light flux. Thin film cells can readily be customized to work efficiently under concentrated light. As an example, FIG. 11A describes the structure of a CIGS cell, where a substrate 121, a molybdenum layer 122, a CIGS layer 123 (absorption layer), a CdS layer 124 (buffer layer), a high resistance ZnO layer 125, a conductive ZnO layer 126 (transparent conductive layer), and anti-reflection $MgF_2$ layer 128 are formed in that order. A conductive grid structure 127 is formed in the anti-reflection $MgF_2$ layer 128. An indium (ITO) structure 129 is formed to function as the back contact.

Figure 11B:
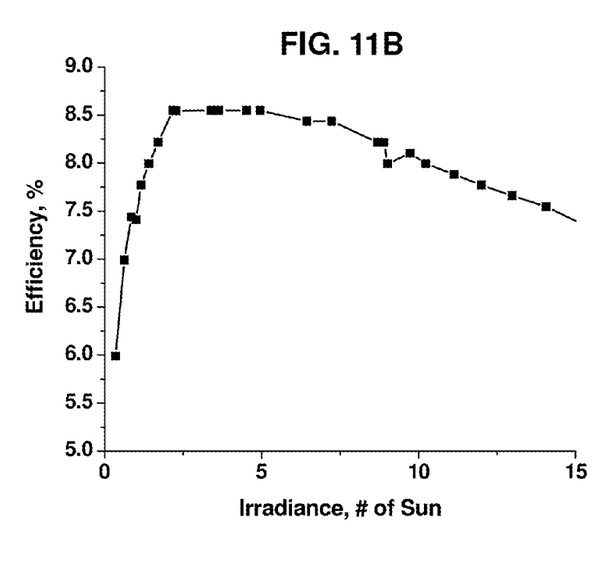
FIG. 11B illustrates performance curve of a CIGS solar cell under concentrated light.
Figure 11C:
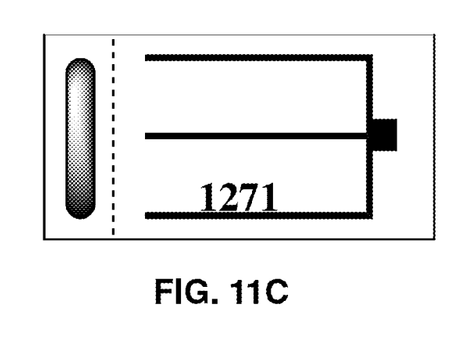
FIGS. 11C-11F schematically illustrates various improved designs of CIGS solar cells according to embodiments of the present invention.
Figure 11D:
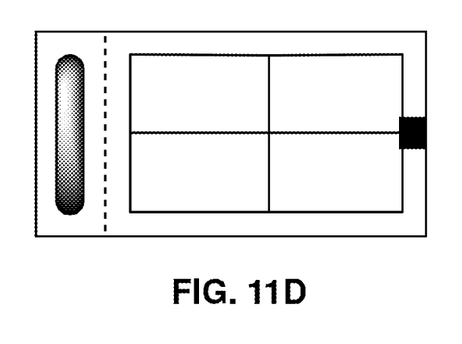
Figure 11E:
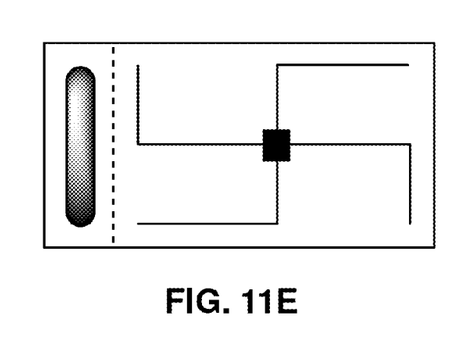
Figure 11F:
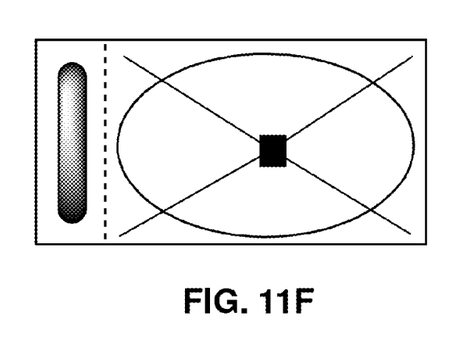

FIG. 11B illustrates the performance of a conventional CIGS cell under different irradiance. The efficiencies are enhanced under concentrated light as compared to under the standard 1 sun, until at least 15 suns. Even without any customization for the purpose of concentrator applications, the peak efficiency at 5 suns reaches 8.6%, which is about 15% higher than the 7.4% efficiency under 1 sun. As an example, the following modifications can be made to further increase the efficiency of thin film CIGS cells:

1. Modify the geometry and area of the front conductive grid structure as shown in FIG. 11C-11F. Conventional front grid is not able to effectively collect large current generated under concentrated light. This leads to the decrease in fill factor under high concentration. Due to this reason, in FIG. 11B, the highest efficiency achievable is limited at 8.6% and then decreases when light intensity is higher than 5 suns. To overcome this problem, as shown in FIG. 11C, the width of the grid 1271 is increased to 100 μm (or more generally, between 90 and 150 μm), where the grid only takes ~5-6% of the total cell area in exchange of at least relative 15% increase in efficiency. Another way to collect the current more efficiently is to re-design the grid to provide grid patterns as in FIG. 11D-11F. As shown in these figures, the lines of the grid pattern have multiple branches electrically connected together, including two sets of multiple parallel grid lines extending in two perpendicular directions and intersecting each other (FIG. 11D), multiple grid lines connected in a center area of the cell and extending in different directions (FIG. 11E), multiple radial grid lines connected in a center area of the cell and one or more circular or oval grid lines around the center area and intersecting the radial lines (FIG. 11F). The grid is more evenly distributed over the entire cell surface without occupying much more area.

2. Increase the Ga content in the CIGS layer; so that the open circuit voltage is increased while the current is lowered. A typical efficient CIGS cell has a current density of 35 $mA/cm^2$. Under concentrated light such as 10×, a small 1 $cm^2$ cell will give a current of 0.35 A. Such a high current will results in a great loss on the grid, since just the heat loss is equal to $I^2R$, where I is the current and R is the resistance. To avoid the loss and also the potential damage to the grid, high voltage and low current are preferred. In CIGS cells, this may be achieved by increase the Ga content x [x =Ga/(Ga+In)]. The x is in the range of 0.2-0.3 for conventional cells; however, it can be increased to 0.7 to nearly double the open circuit voltage. Meanwhile, since the efficiency decreases only slightly, the current is lowered to half to avoid ¾ of the heat loss.

3. Use thermally conductive substrate to dissipate the heat faster. A challenge for conventional concentrator is how to maintain a relative low temperature of the cells to keep them from burning, which is very difficult under conditions of hundred to thousand concentration. However, the CIGS cell can be deposited on thermally conductive substrates such as metal foil or silicon carbide to minimize this problem. Additionally, as mentioned earlier, flexible foil substrates give the cell more freedom to be shaped to accommodate the optics design.

Figure 12:
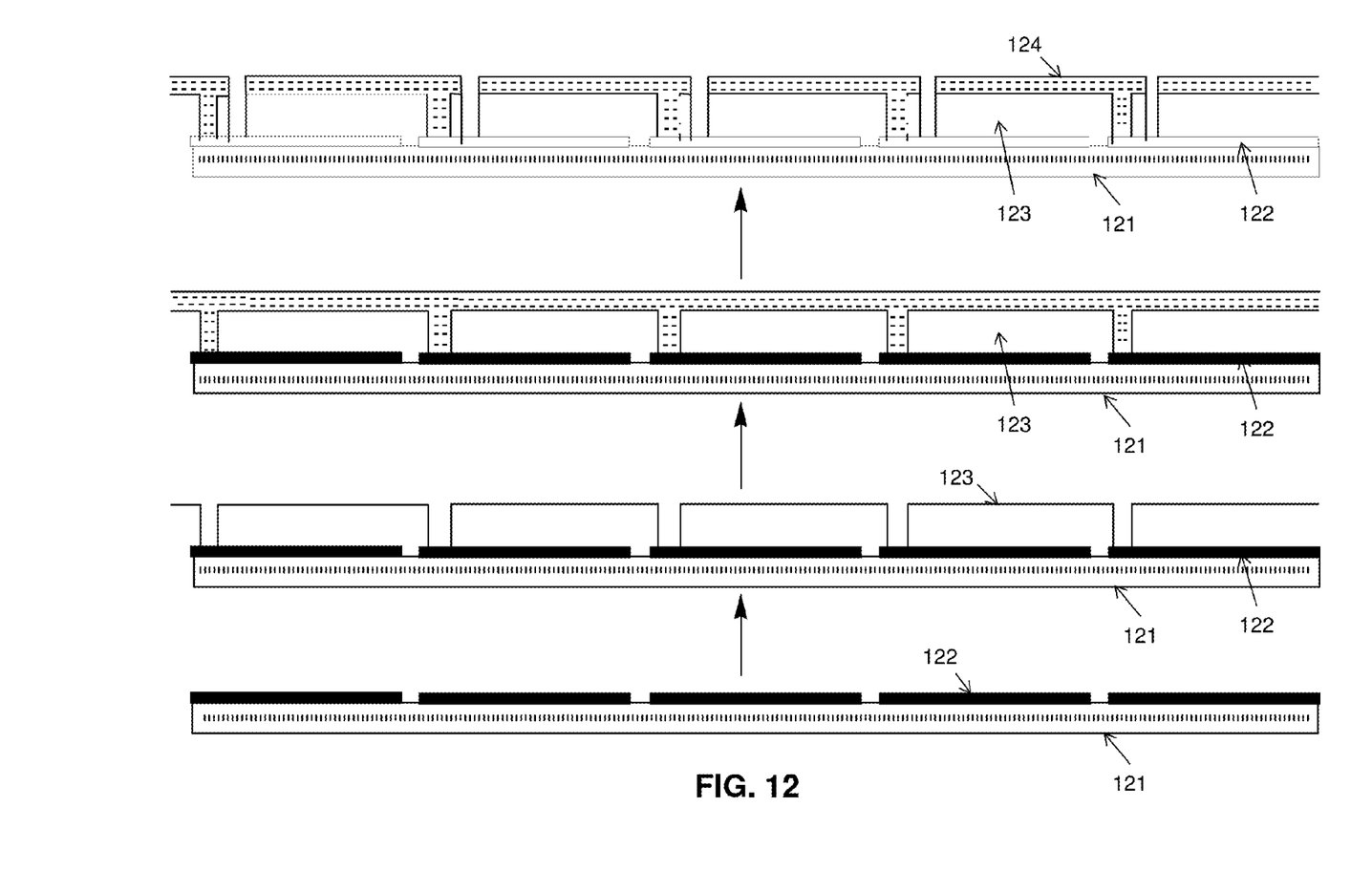
FIG. 12 schematically illustrates the manufacturing steps for forming thin film solar cells with monolithic interconnections.

Finally, in the module production, serial connection between cells is preferred to parallel connection, because parallel connection generates large current and extreme heat. Therefore, monolithic interconnection, a common advantage in thin film modules fabrication over silicon wafers, is an excellent fit for concentrator applications. In the fabrication steps shown in FIG. 12, a back contact layer 122 is deposited on a substrate 121 and patterned into individual back contact areas. An active layer 123 is deposited over the back contact layer 122, and patterned into individual cell areas. Each cell area overlaps two back contact areas 122. A conductive front contact layer 124 is deposited on the active layer 123. The active layer 123 and the conductive front contact layer 124 are patterned to expose areas of the back contact layer 122. The patterning may be done by laser ablation or mechanical scribing. This fabrication method directly forms a module with series connection.

It will be apparent to those skilled in the art that various modification and variations can be made in the thin-film concentrator solar cells and related fabrication method of the present invention without departing from the spirit or scope of the invention. Thus, it is intended that the present invention cover modifications and variations that come within the scope of the appended claims and their equivalents.

What is claimed is:

1. A concentrating thin film solar cell system, comprising:
    a condenser system including a hemispherical Fresnel lens for collecting and condensing sunlight, wherein the hemispherical Fresnel lens is a refractive optical element which focuses sunlight by refraction onto a hemispherical focal surface which is a surface having a hemispherical shape and located away from a hemispherical center of the Fresnel lens and spatially separated from the hemispherical Fresnel lens; and
    a plurality of thin film solar cells located at different areas of the hemispherical focal surface for receiving the condensed sunlight and generating electricity,
    wherein sunlight incident onto the hemispherical Fresnel lens from different angles is focused by the hemispherical Fresnel lens onto different areas of the hemispherical focal surface and received by different ones of the plurality of thin film solar cells located at the corresponding different areas of the hemispherical focal surface, and
    wherein each thin film solar cell includes a substrate, a back contact electrode, an absorption layer, a buffer layer, a transparent conductive layer and a conductive grid structure deposited sequentially on the substrate.

2. The system of claim 1, wherein the thin film solar cells are arranged on the hemispherical focal surface of the Fresnel lens.

3. The system of claim 1, wherein the thin film solar cells are a-Si, CdTe, $Cu(InGa)Se_2$, organic solar cell or dye sensitized solar cells.

4. The system of claim 1, wherein the conductive grid structure of each thin film solar cell conducts electricity generated by the thin film solar cell, the grid including one or more of: two sets of multiple parallel grid lines extending in two directions perpendicular to each other and intersecting each other, multiple grid lines connected in a center area of the thin film solar cell and extending in different directions, and multiple radial grid lines connected in the center area of the thin film solar cell and one or more circular or oval grid lines around the center area and intersecting the radial lines, and wherein a width of the grid lines is between 90 and 150 μm.

5. The system of claim 1, wherein the condenser system has a concentration ratio of about 10 to 100.

* * * * *